(12) United States Patent
Raben (10) Patent No.: US 9,754,913 B2
(45) Date of Patent: Sep. 5, 2017

(54) INTEGRATED CIRCUIT PACKAGE (71) Applicant: SENCIO B.V., Nijmegen (NL)

(72) Inventor: Jurgen Leonardus Theodorus Maria Raben, Nijmegen (NL)

(73) Assignee: SENCIO B.V., Nijmegen (NL)

(*) Notice: Subject to any disclaimer, the term of this patent is extended or adjusted under 35 U.S.C. 154(b) by 0 days.

(21) Appl. No.: 15/030,289

(22) PCT Filed: Oct. 7, 2014

(86) PCT No.: PCT/NL2014/050697
§ 371 (c)(1),
(2) Date: Apr. 18, 2016

(87) PCT Pub. No.: WO2015/057058
PCT Pub. Date: Apr. 23, 2015

(65) Prior Publication Data
US 2016/0276304 A1 Sep. 22, 2016

(30) Foreign Application Priority Data

Oct. 18, 2013 (NL) .................................... 2011638
Sep. 1, 2014 (NL) .................................... 2013395

(51) Int. Cl.
H01L 23/00 (2006.01)
H01L 25/065 (2006.01)
H01L 27/146 (2006.01)
H01L 23/13 (2006.01)
(Continued)

(52) U.S. Cl.
CPC .............. *H01L 24/73* (2013.01); *H01L 23/13* (2013.01); *H01L 23/16* (2013.01); *H01L 23/3107* (2013.01); *H01L 23/49805* (2013.01); *H01L 24/48* (2013.01); *H01L 25/0657* (2013.01); *H01L 27/14636* (2013.01);
(Continued)

(58) Field of Classification Search
CPC ....... H01L 25/0657; H01L 2924/16235; H01L 27/14636; H01L 23/13
See application file for complete search history.

(56) References Cited

U.S. PATENT DOCUMENTS 5,229,641 A 7/1993 Katayama
2004/0159927 A1 8/2004 Loo et al.
(Continued)

FOREIGN PATENT DOCUMENTS

EP 2 090 873 A1 8/2009
EP 2 216 814 A2 8/2010
(Continued)

OTHER PUBLICATIONS

International Search Report, dated May 11, 2015, from corresponding PCT Application.

Primary Examiner — Ngan Ngo
(74) Attorney, Agent, or Firm — Young & Thompson (57) ABSTRACT Integrated circuit package including an integrated circuit, external connection elements (3) connected to the integrated circuit, a package material (2) enclosing the integrated circuit, and a mechanical element (5, 6, 7) allowing a mechanical connection of a further element to the integrated circuit package (1). The mechanical element (5, 6, 7) is e.g. an attachment element (5); a mechanical element (5), optionally with a thread; a bushing element; a bearing element (7); an electrical connector (6).

15 Claims, 5 Drawing Sheets (51) Int. Cl.
- H01L 23/16 (2006.01)
- H01L 23/31 (2006.01)
- H01L 23/498 (2006.01)
- H01L 43/06 (2006.01)
- H01L 43/08 (2006.01)

(52) U.S. Cl.
CPC .............. H01L 43/06 (2013.01); H01L 43/08 (2013.01); *H01L 2224/32225* (2013.01); *H01L 2224/32245* (2013.01); *H01L 2224/48091* (2013.01); *H01L 2224/48245* (2013.01); *H01L 2224/48247* (2013.01); *H01L 2224/73265* (2013.01); *H01L 2924/00014* (2013.01); *H01L 2924/13055* (2013.01); *H01L 2924/13091* (2013.01); *H01L 2924/16235* (2013.01); *H01L 2924/181* (2013.01); *H01L 2924/1815* (2013.01); *H01L 2924/18301* (2013.01)

(56) References Cited

U.S. PATENT DOCUMENTS

| | | |
|---|---|---|
| 2007/0215999 A1 | 9/2007 | Kashimoto et al. |
| 2009/0051479 A1 | 2/2009 | Nishimura et al. |
| 2010/0033616 A1* | 2/2010 | Huang ............... G02B 7/021 348/335 |
| 2010/0052082 A1* | 3/2010 | Lee .................. B81B 7/0061 257/416 |
| 2010/0207217 A1* | 8/2010 | Zuniga-Ortiz ....... B81C 1/0023 257/415 |
| 2010/0327709 A1* | 12/2010 | Minato ................ H05K 1/18 310/68 D |
| 2011/0242767 A1* | 10/2011 | Okamoto ............ H01P 1/218 361/714 |
| 2011/0274299 A1* | 11/2011 | Shaw ............... B81B 7/0064 381/174 |
| 2013/0215585 A1 | 8/2013 | Kusano et al. |
| 2014/0204431 A1* | 7/2014 | Tsuchiya ........... G02B 26/122 358/474 |
| 2016/0122181 A1* | 5/2016 | Picco ............... B81B 7/0058 257/419 |

FOREIGN PATENT DOCUMENTS

| | | |
|---|---|---|
| JP | H5-243070 A | 9/1993 |
| JP | 2000-121309 A | 4/2000 |
| JP | 2004-147468 A | 5/2004 |

* cited by examiner

INTEGRATED CIRCUIT PACKAGE

FIELD OF THE INVENTION

The present invention relates to an integrated circuit package comprising an integrated circuit, external connection elements connected to the integrated circuit, and a package material enclosing the integrated circuit.

PRIOR ART

Such an integrated circuit package is known from European patent publication EP-A-2 090 873 of applicant. In the embodiments shown here, the integrated circuit may comprise various components, such as a sensor assembly with a sensors/face, carrier element for holding the sensor assembly and further associated components, such as processing electronics (IC or ASIC).

American patent publication US2007/215999 discloses a semiconductor device wherein a resin package encloses an integrated circuit including terminals 90, 92, 96 extending perpendicular to a substrate surface. The terminals can be provided with an internal screw thread.

American patent publication US2013/215585 discloses a package for an integrated circuit having a through hole 3 therein. The through-hole 3 accommodates an electrical connection terminal 4, which can e.g. be contacted using an external pin contact 12.

European patent publication EP-A-2 216 814 discloses an integrated circuit where bushes 16 are provided on contact pads of an integrated circuit. The bushes 16 ensure openings are available in a package surrounding the IC, in which connecting terminals 14 may be provided as external electrical contacts.

SUMMARY OF THE INVENTION

The present invention seeks to provide an improved integrated circuit package, allowing more robust and reliable operation of the integrated circuit package, e.g. as a complete sensor package with a sensor, such as a pressure, temperature or position sensor.

According to the present invention, an integrated circuit package according to the preamble defined above is provided, the integrated circuit package further comprising a mechanical element allowing a mechanical connection of a further element to the integrated circuit package. The mechanical element can be of an open type (through hole) or a closed version type.

By adding such a mechanical element in an integrated circuit package, further functional capabilities, external connection implementations, and low-cost solutions can be provided for integrated circuit packages, especially for integrated circuit packages including a sensor. The external connection elements are e.g. bended leads, leads, pins, lead pads, solder balls, connection-holes, etc.

In an embodiment, the mechanical element is selected from the group consisting of an attachment element; a mechanical element with a (n internal) thread; a bushing element; a bearing element; an electrical connector. This allows various connections to be implemented with an integrated circuit package, ranging from mechanical to electrical connections.

The integrated circuit package may comprise a sensor element connected to the integrated circuit in a further embodiment, wherein the mechanical element is not providing an external communication channel to the sensor element. E.g. the external communication channel may be provided in a part of the integrated circuit package where it cannot interfere with the mechanical element of the present invention embodiments.

In a further embodiment, the mechanical element is attached to a structural element of the integrated circuit package, such as a lead frame, a support frame, a ceramic substrate or a multi chip module. This results in an improved strength of the total integrated circuit package, and allows a more easy assembly process for molding the package.

The mechanical element is suspended in the integrated circuit package in an even further group of embodiments. This may be implemented in an embodiment, wherein the package material is formed by a two step molding process. No functional relationship is then present between mechanical element and sensor element of other (structural) parts of the integrated circuit package.

In a further embodiment, the integrated circuit package further comprises a sensor element connected to the integrated circuit, and a communication channel to the sensor element is provided via the suspended mechanical element. This allows external connection of further elements, such as tubing, to allow external environmental elements, e.g. external air, to reach the sensor surface.

The mechanical element may be provided with an external interface surface in a further embodiment, and the integrated circuit package material is present (e.g. molded) around the remaining external surface of the mechanical element. This allows a good mechanical interface with further components outside the integrated circuit package, yet also allows proper protection of the covered parts of the mechanical element.

In an exemplary embodiment, the mechanical element is a bearing element, and the integrated circuit package further comprising a sensor inside the package, an external connection axis supported by the bearing element, and a sensor activation element attached to the external connection axis. The sensor may be a Hall or magneto-resistive sensor, and the sensor activation element is an active-type element (such as a magnet or magnetized element) or a passive-type element (whereby the magnetization is replaced by a tooth structure).

SHORT DESCRIPTION OF DRAWINGS

The present invention will be discussed in more detail below, using a number of exemplary embodiments, with reference to the attached drawings, in which

FIG. 7a-e show a cross sectional view of further embodiments of the present invention;

DETAILED DESCRIPTION OF EXEMPLARY EMBODIMENTS

Figure 1:
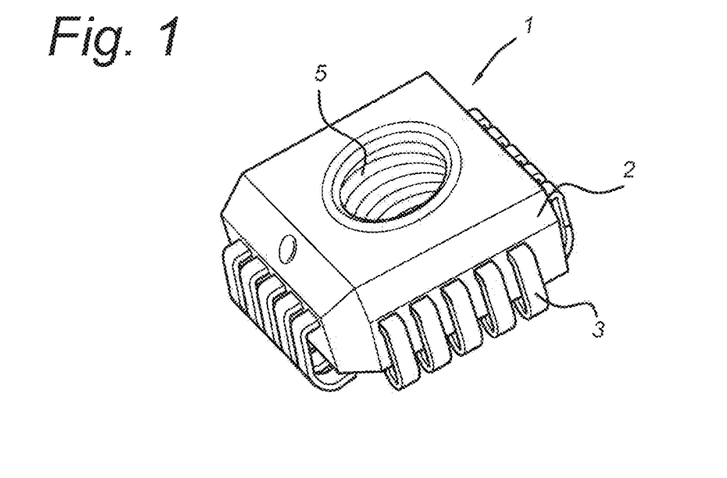
FIG. 1 shows a perspective view of a first embodiment of the present invention.
Figure 2:
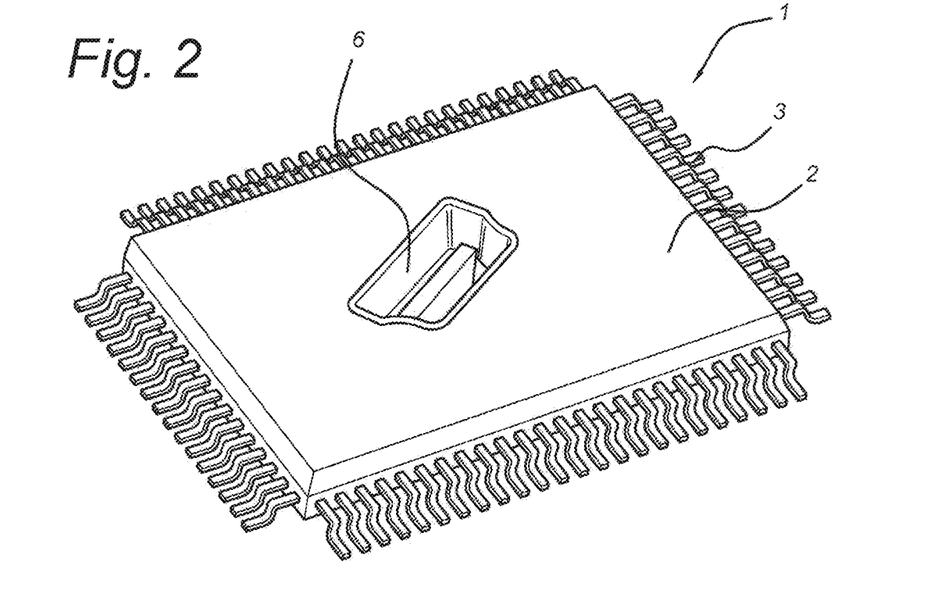
FIG. 2 shows a perspective view of a second embodiment of the present invention.
Figure 3:
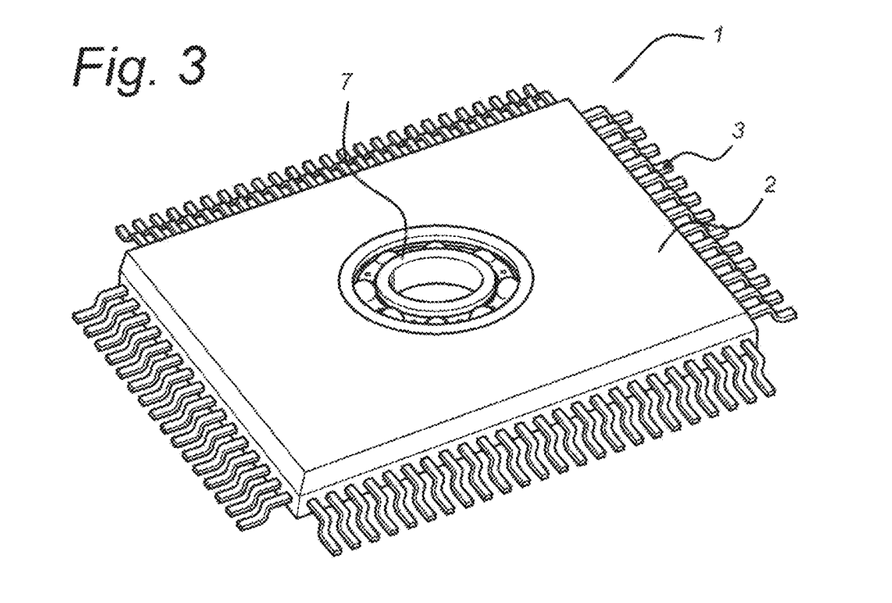
FIG. 3 shows a perspective view of a third embodiment of the present invention.

FIGS. 1 to 3 each show an embodiment of an integrated circuit package according to the present invention. The package comprises an integrated circuit and external connection elements 3 connected to the integrated circuit inside the package (e.g. using bond wires or flip chip). The external connection elements 3 can be connected to an electrical circuit on e.g. a printed circuit board.

Package material 2 of the integrated circuit package 1 encloses the integrated circuit tightly, thereby providing protection. The integrated circuit package further comprises a mechanical element 5, 6, 7 allowing a mechanical connection of a further element to the integrated circuit package 1. The further element is e.g. a cooling body at attachment element(s) for such a cooling body, an electrical connector (e.g. a (mini-) USB connector, a guiding element for alignment purposes, or an axis as part of a sensor assembly.

The surprising technical effect of the presence of the mechanical element 5, 6, 7 is that the integrated circuit package 1 can be mechanically mounted and/or centered and/or electrically connected to other parts or subassemblies. The mechanical element 5, 6, 7 provides robust mechanical fixation on next level assemblies and/or onto other elements such as cooling blocks. Further electrical connections can also be made through the mechanical element 6, for example, the mechanical element 6 may provide an electrical connection to a power supply, further electronics, a computer etc. The mechanical element 6 in the form of an electrical connector can be implemented in many variants, such as the USB connector mentioned above, or e.g. a wire-connection (known in the field as e.g. 'schneidklemmtechnik').

In an embodiment, the mechanical element 5, 6, 7 is selected from the group consisting of an attachment element 5; a mechanical element 5 with a thread; a bushing element; a bearing element 7; an electrical connector 6.

In typical embodiments, the package material 2 is a duroplast plastic material for providing solid anchoring and encapsulation of the mechanical element 5, 6, 7.

In an embodiment, the attachment element 5 may be a snap fit connector for a rapid and easy connection. In a further embodiment, the mechanical element 5 may be a standardized bolt or nut, so that the mechanical element 5 may comprise an internal and/or external threaded part.

The integrated circuit package 1 can then be robustly mounted and attached to other subassemblies. This embodiment may also be advantageous in view of vibratory environments, where the external connection elements 3 and/or a delicate sensor inside the integrated circuit packages 1 cannot sustain long periods of harsh vibrations. A firm fixation though a mechanical element 5 having a threaded part may resolve this issue. In addition to the fixation/vibration solution the mechanical element 5 can function as a cooling element as well. The heat generated by the integrated circuit element 4 e.g. a IGBT or MOSFET can be dissipated to the ambient via the mechanical element 5 acting as a heat sink.

In further embodiments, centering the integrated circuit package 1 with respect to other parts or subassemblies is readily accomplished by a mechanical bushing element 5, e.g. a guide bushing. Such a bushing element 5 provides high precision centering of the integrated circuit package 1 but may allow for some rotational and linear sliding movement with respect to a connecting element disposed in the bushing element 5.

For example, the integrated circuit package 1 may comprise a position sensor and should be able to move with respect to e.g. a connecting element slidably disposed inside the bushing element. Further, the integrated circuit package 1 may be subjected to temperature and/or pressure changes, so that allowing for some sliding movement of the mechanical bushing element 5 with respect to a connecting element disposed therein may minimize stress and strain forces inside the integrated circuit package 1 as a result of such temperature and/or pressure changes.

In certain situations the integrated circuit package 1 is intended to be connected to various different external devices. In an embodiment, the mechanical element 6 may comprise an electrical connector for utilizing standard communication protocols for an external device, e.g. USB, FireWire, HDMI etc. Embedding such an electrical connector 6 in the integrated circuit package 1 avoids additional external connecting element 3, thereby simplifying e.g. a printed circuit board (PCB) onto which the integrated circuit package 1 may be mounted. The mechanical element 6 in the form of an electrical connector 6 may thus provide supplemental functionality that need not be implemented into a PCB onto which the integrated circuit package 1 is mounted.

In further embodiments, the mechanical element 7 may be a mechanical bearing element 7 allowing a shaft or axis to be rotatably mounted in the integrated circuit package 1. Such a mechanical bearing element 7 may be particular advantageous in case the package 1 comprises e.g. a position sensor, e.g. a rotational (Magneto Resistive) MR sensor type, wherein rotating a connecting element inside the bearing 7 with respect to the integrated circuit package 1 measures a rotation of said package 1 with respect to the connecting element inside the bearing 7.

The type of mechanical element 5, 6, 7 used may be determined by a particular application of the integrated circuit package 1. For example, in case the package 1 comprises a temperature or pressure sensor, fixation through a mechanical threaded element 5 may be desired. Should the integrated circuit package 1 comprise a mechanical motion sensor, embedding a mechanical bearing element 7 is advantageously used.

It is also possible that the mechanical element 5, 6, 7 is chosen based on an assembly process. For example, having a mechanical bushing element 5 embedded in the integrated circuit package 1 may facilitate the use of pick-and-place robots for handling the integrated circuit package 1. In such an application a robot may slidably insert a pin element inside the bushing 5 and slidably rotate/orientate the integrated circuit package 1 with respect to e.g. a PCB.

In the embodiments of FIGS. 1 to 3, the integrated circuit package 1 may further comprise an external communication channel through the package material 2 for exposing a sensing surface of a sensor element inside the package 1 to the outside environment, thereby facilitating e.g. temperature and/or pressure measurements. Such an external communication channel is conveniently provided by an embedded (hollow) mechanical element 5 in the package material 2, such as a nut and/or or guide bushing which typically comprise a bore running there through. The bore of the mechanical element 5 then comprises at least in part the external communication channel.

In a further embodiment of an integrated circuit package 1, the package 1 comprises a sensor element 20 connected to the integrated circuit, and the mechanical element 5, 6, 7 is not providing an external communication channel to the sensor element 20. In this embodiment, the mechanical element 5, 6, 7 is embedded in the package material 2 away from the sensor element 20, i.e. in no direct contact with the sensor die or sensor surface of the sensor element 20. This may be possible when the sensor element 20 does not require a direct exposure to the outside environment through an external communication channel. This embodiment is particular suitable for a sensor element 20 utilizing field phenomena, such as a magnetic and/or electric field, which easily penetrate the package material 2. In an alternative to this embodiment, the sensor element 20 is in communication with the external environment using an external communication channel routed away from the mechanical element 5, 6, 7 (e.g. via a back side of the package 1).

According to a further invention embodiment, the mechanical element 5, 6, 7 is suspended in the integrated circuit package 1. In this embodiment the mechanical element 5, 6, 7, is in a suspended arrangement with respect to the package material 2, on that the mechanical element is solely supported by package material 2 and does not come into contact with a structural element 22, sensor element 20, or the external connecting elements (e.g. lead frame) 21 in the integrated circuit package 1. Suspending the mechanical element 5, 6, 7 solely in package material 2 reduces the risk of damaging internal parts the package 1, such as sensitive and delicate sensing materials and/or various electronics. This embodiment may be accomplished using a two-stage process, as explained in greater detail with reference to FIG. 7 below.

Figure 4:
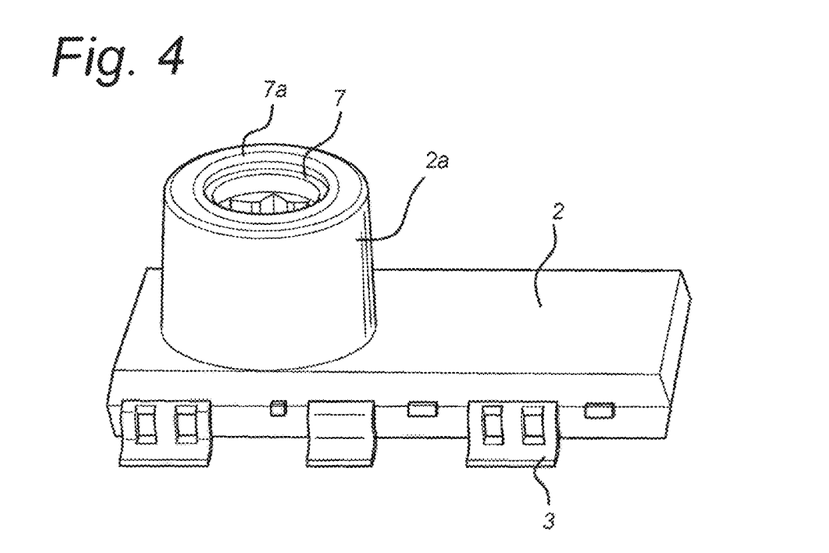
FIG. 4 shows a perspective view of an alternative of the third embodiment of the present invention.

FIG. 4 shows another embodiment of the integrated circuit package 1 of the present invention. In this embodiment, the mechanical element 7 has an external interface surface 7a and the package material 2 is present (e.g. molded) around the remaining external surface of the mechanical element 7. In this embodiment the interface surface 7a (e.g. parallel to a main surface of the integrated circuit package 1) remains free from package material 2, so that said surface 7a may abut against another surface part or subassembly. This embodiment is advantageous in case a snug and precise fit of the mechanical element 5, 6, 7 against another surface part is required, as might be the case when the mechanical element 5, 6, 7, is implemented as a bearing element 7.

In a further embodiment, the integrated circuit package 1 comprises a projection 2a of package material 2, wherein the mechanical element 5, 6, 7 is at least in part embedded in the projection 2a distal to the integrated circuit package 1. The projection allows for an offset of the mechanical element 5, 6, 7, with respect to the integrated circuit package 1.

Figure 5:
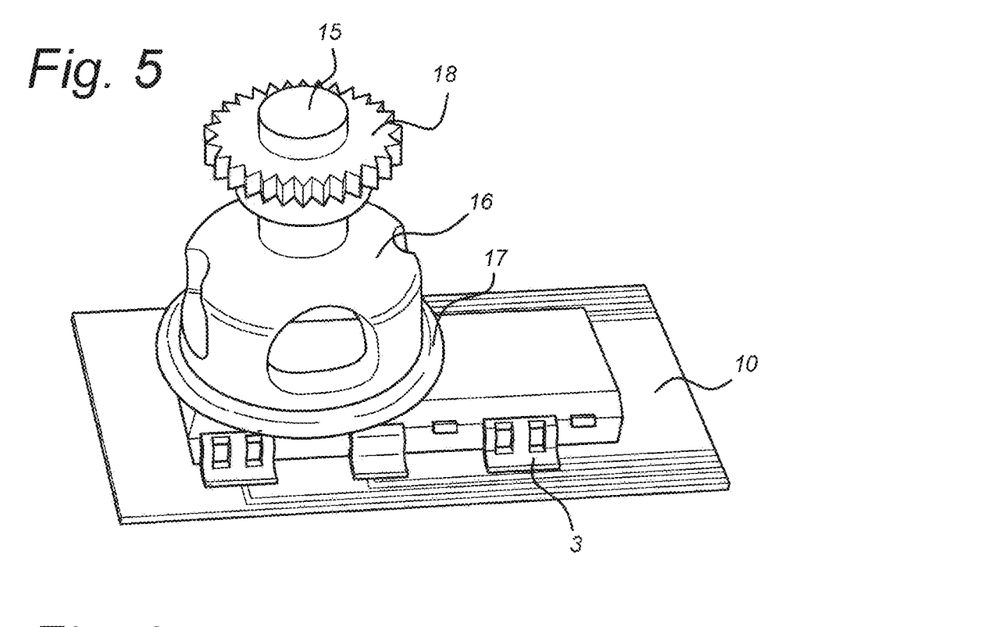
FIG. 5 shows a perspective view of an even further embodiment of the present invention.
Figure 6:
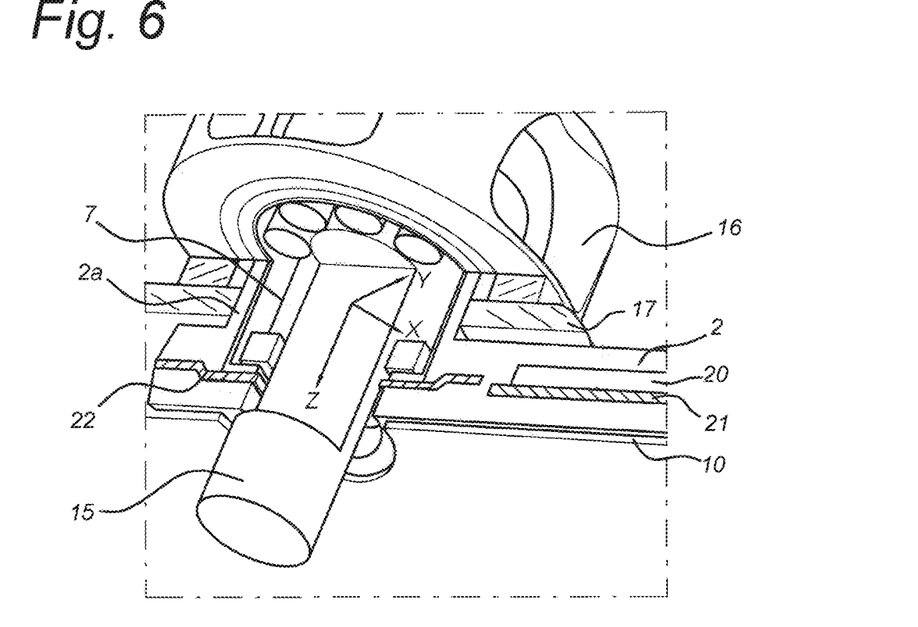
FIG. 6 shows a three dimensional view with a part cut-out view of the embodiment of FIG. 5.

FIGS. 5 and 6 show embodiments of the integrated circuit package 1 of the present invention, wherein the mechanical element 5, 6, 7 is a bearing element 7, and the integrated circuit package 1 further comprises a sensor element 20 inside the package 1, an external connection axis 15 supported by the bearing element 7, and a sensor activation element 17 attached to the external connection axis 15. The external connection axis 15 is attached to an external housing 16 and configured for rotating the activation element 17. The activation element can be an active-type (magnetized) or passive-type whereby the magnetization is replaced by a tooth structure. In further embodiments the external connection axis 15 is provided with a cog 18 for rotation thereof, allowing a mechanical connection to an external subassembly in a simple and reliable manner. The external connection axis 15 (and hence mechanical element 7 in the form of a bearing element) may penetrate entirely through the integrated circuit package 1, or alternatively, may be present only on one side (closed version of the mechanical element) of the integrated circuit package 1. The bearing element 7 may be embodied as a simple guiding bush.

In an embodiment, the sensor element 20 is a Hall or magneto-resistive (MR) sensor and the sensor activation element 17 is a magnet. Here the mechanical element 7 need not provide a direct external communication channel to the outside environment as the sensor element 20 senses a magnetic field change between north and south poles penetrating the package material 2.

In the embodiment of FIGS. 5 and 6, the mechanical element 5, 6, 7 is attached to a structural element 22 of the integrated circuit package 1, such as a lead frame, a support frame, a (ceramic or PCB) substrate or a multi chip module. Having the mechanical element 5, 6, 7, in direct contact with the structural element 22 may provide further strength to the embedded arrangement of the mechanical element 5, 6, 7 in the package material 2.

Figure 7A:
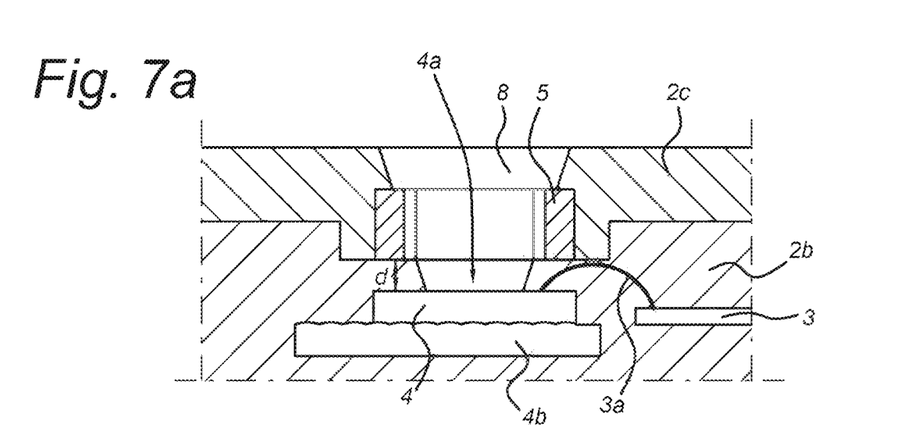
Figure 7B:
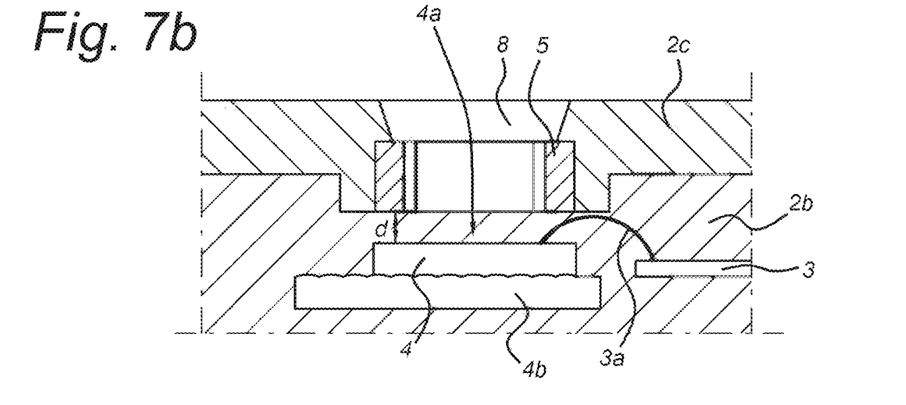
Figure 7C:
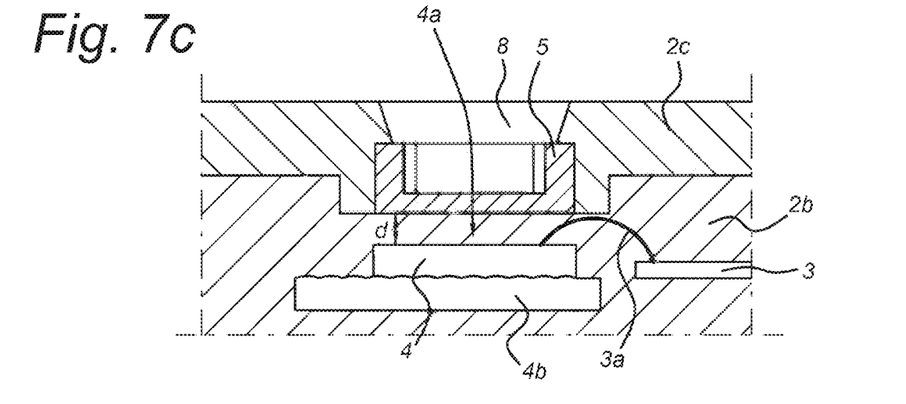

FIG. 7a-c show a cross sectional views of an integrated circuit package 1 according to further embodiments. The package 1 comprises external connector elements 3 (cf. embodiments of FIG. 1-3), such as a lead frame, electrically connected to an integrated circuit element 4 through one or more bonding wires 3a. The integrated circuit element 4 typically comprises an IC chip and/or a semiconductor die having a sensitive surface area 4a, wherein the sensing surface 4a is exposed to the outside environment through an external communication channel 8. The sensitive surface area 4a is e.g. implemented as a MEMS (e.g. pressure measurement) or as a capacitive, temperature, optical or magnetic sensor (e.g. based on Hall or Magneto Resistive measurements).

The package material 2 forming the integrated circuit package 1 is formed in a two-step process. First, the integrated circuit element 4, lead frame 3 and bonding wires 3a are enclosed by package material (e.g. using a molding process), where the communication channel 8 towards the sensor surface 4a is kept free from packaging material, and a first package part 2b is formed. The mechanical element 5 (having a bore running there through) is then positioned on top of the first package part 2b and aligned with the external communication channel 8 (thus extending the external communication channel 8) at least in part. In the second step, package material is again added to a further mold on top of the first package part 2b, thus forming the second package part 2c. When viewed from the sensing surface 4a, the external communication channel 8 is then defined by the first package part 2b, the bore of the mechanical element 5, and the second package part 2c.

This first package material layer 2b particularly advantageous in cases where the mechanical element 5 should not come into direct contact with a delicate integrated circuit element 4 and/or sensing surface 4a. To that end, the mechanical element 5 is disposed on the first package material layer 2b instead, resulting in an offset from the integrated circuit element 4 and/or sensing surface 4a by a predefined distance d. Offsetting the mechanical element 5 may reduce any form of interference with the IC element 4 and or sensing surface 4a for improving measurement accuracy.

In a further set of embodiments, the mechanical element 5 is a metal element suspended in the integrated circuit package 1, e.g. using the two-step molding process as described above. In a single integrated circuit package 1, one or more metal elements 5 may be provided. If multiple metal elements 5 are present, they may be interconnected in a mechanical and/or electrical sense. Furthermore, the metal element has a bar shape or a strip shape, These embodiments may be advantageously used integrated sensing integrated circuit packages 1.

In the embodiment shown in FIG. 7a, the integrated circuit element 4 is suspended in package material 2 and electrically connected to the external connector elements 3 through the one or more bonding wires 3a. In a further embodiment the integrated circuit element 4 may also be supported by the external connecting elements 3, such as a lead frame. In yet a further embodiment, the integrated circuit package 1 comprises a substrate 4b (e.g. a ceramic or glass substrate, possibly as part of a multi chip module, MCM). and the integrated circuit element 4 is supported thereby.

A further embodiment is shown in FIG. 7b, which shows a suspended mechanical element 5 by using the two step molding. In this case there is no contact with the semiconductor element 4 or a sensor element/sensing surface 4a or a carrier 4b (lead frame, PCB, ceramic etc). An even further embodiment is shown in FIG. 7c, which depicts a suspended mechanical element 5 by using the two step molding. In this case the mechanical element 5 is a closed version type (in this case a closed off bottom).

The above embodiments where the mechanical element 5 is a mechanical connection element, such as an element with an internal screw thread, may be advantageously used in an integrated circuit package 1 with a sensor element 4 and an external communication channel 8. Alternatively, the mechanical element 5 is provided with an internal diameter larger than the sensor surface 4a (or even larger than sensor die 4), and attached to an underlying lead frame 3 or other structural frame element. This would still provide an external communication channel 8 that can be connected to a further element (e.g. a flexible conduit or tubing) and still providing an air tight space to the sensor surface 4a.

In a further group of embodiments the mechanical element is an attachment element 5 of a thermoplast material partly exposed from the integrated circuit package 1. The partly exposed part of die attachment element 5 can extend from the surface of the integrated circuit package 1, or it may be flush with the surface of the integrated circuit package 1, or even be (partly) below the surface of the integrated circuit package 1, or even a combination thereof.

Figure 8A:
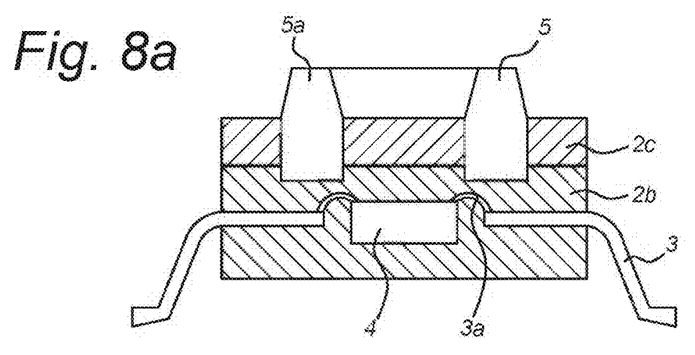
FIGS. 8a and b show cross sectional views of even further embodiments of the present invention.
Figure 8B:
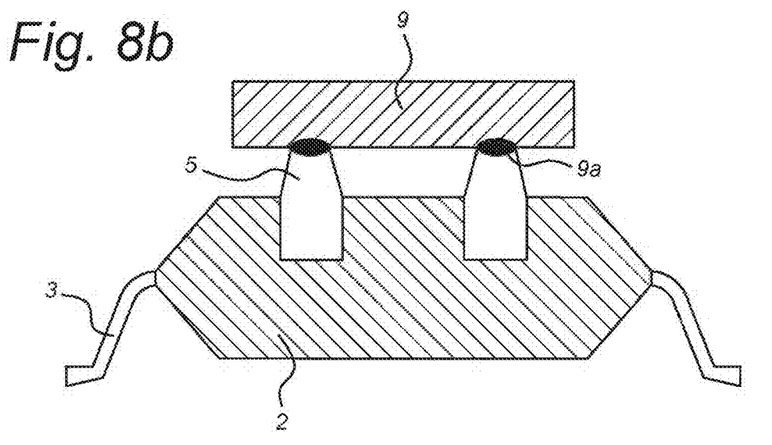

Exemplary embodiments are shown in cross sectional views in FIGS. 8a and 8b. FIG. 8a shows an embodiment, where the mechanical element is an attachment element 5, which is suspended in the package material 2b, 2c. During assembly, the attachment element 5 is provided in the package material 2b, 2o in a two-step moulding process. The attachment element 5 is of a thermoplast material (as opposed to the regular duroplast or thermosetting material used as the package material 2b, 2c). This allows attachment of a further sub-module 9 to an exposed part 5a of the attachment element 5, as shown in the cross sectional view of FIG. 8b. The attachment element 5 may further be adapted to be anchored in the package material 2b, 2c, e.g. by using a specific shape at the lower side. Also the further sub-module 9 may be provided with an extending surface profile 9b, matching the surface profile of the exposed part 5a.

Furthermore, the attachment element 5 may be substantially ring-shaped or may have a rectangular or other form, with or without an opening or aperture in a central part, and one or more attachment elements 5 may be provided in a single integrated circuit package 1. The exposed part 5a may be provided with a flat surface or other surface lay-out allowing easier attachment of the sub-module 9, i.e. at the location 9a as shown in the embodiment of FIG. 8b.

Attachment of the sub-module 9 can be accomplished using one of several techniques exploiting the thermoplast nature of the attachment element 5 material, i.e. friction welding, gluing, softening using a solvent, melting/curing etc. Especially when the part of the sub-module 9 in contact with the attachment element 5 when assembled is also of a thermoplast material, attachment may be accomplished in a very efficient and robust manner.

Figure 9:
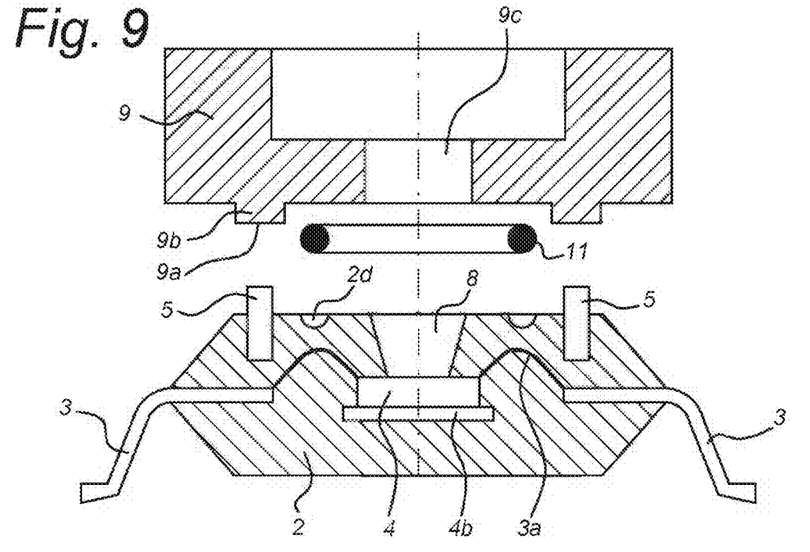
FIG. 9 shows across sectional view of yet another embodiment of the present invention.

In a further embodiment, which is shown schematically in the cross sectional view of FIG. 9, an additional sealing element 11 may be used which is in contact with the package material 2 of the integrated circuit package 1, to ensure a long lasting sealing. In the embodiment shown in FIG. 9, the upper surface of the integrated surface package 1 is provided with a matching sealing groove 2d. Furthermore, the sub-module 9 in this embodiment is provided with a central aperture 9c, matching an external communication channel 8 of the integrated circuit package 1. Also, the sub-module 9 is provided with an extending surface profile 9b, matching the exposed (and extending) part 5a of the attachment element 5. When the sub-module 9 is attached to the attachment element 5 (at locations 9a), the melting (or other attachment method) is applied to the exposed part 5a and the extending surface profile 9b, until the sealing element 11 is properly providing a sealing function between integrated circuit package 1 and the sub-module 9.

The sub-module 9 may be a complex part or just a simple extension of the integrated circuit package 1, e.g. allowing mounting of further element, such as lenses, filters etc., or it may comprise further functional elements to be used in conjunction with the integrated circuit package 1 (e.g. tubing, valves, etc.)

The present invention embodiments have been described above with reference to a number of exemplary embodiments as shown in the drawings. Modifications and alternative implementations of some parts or elements are possible, and are included in the scope of protection as defined in the appended claims. The integrated circuit package 1 (and its contents) may be one of many types, and includes but is not limited to the following examples: a dual-in line package (DIL), surface mount device (SMD) package, ball grid array (BGA) package, land grid array (LGA), quad flat no-leads (QFN) package, dual flat no-leads (DFN) package, etc.

The invention claimed is:

1. An integrated circuit package comprising an integrated circuit, external connection elements connected to the integrated circuit, a package material enclosing the integrated circuit, and a mechanical element allowing a mechanical connection of a further element to the integrated circuit package, wherein the mechanical element is an attachment element of a thermoplast material, partly exposed from the integrated circuit package.

2. The integrated circuit package of claim 1, wherein the integrated circuit package further comprises a sensor element electrically connected to the integrated circuit, and the mechanical element is not providing an external communication channel to the sensor element.

3. The integrated circuit package of claim 1, wherein the mechanical element is attached to a structural element of the integrated circuit package, such as a lead frame, a support frame, a ceramic substrate or a multi chip module.

4. The integrated circuit package of claim 1, wherein the mechanical element is suspended in the integrated circuit package.

5. The integrated circuit package of claim 4, wherein the package material is formed by a two step molding process.

6. The integrated circuit package of claim 4, wherein the mechanical element is an attachment element, or a mechanical element optionally provided with a thread.

7. The integrated circuit package of claim 6, wherein the mechanical element is a metal element suspended in the integrated circuit package.

8. The integrated circuit package of claim 1, further comprising a sealing element in contact with the package material of the integrated circuit package.

9. The integrated circuit package of claim 1, further comprising a sub-module attached to the attachment element.

10. The integrated circuit package of claim 4, wherein the integrated circuit package further comprises a sensor element electrically connected to the integrated circuit, and a communication channel to the sensor element is provided via the suspended mechanical element.

11. The integrated circuit package of claim 1, wherein the mechanical element has an external interface surface, and the integrated circuit package material is present around the remaining external surface of the mechanical element.

12. An integrated circuit package comprising an integrated circuit, external connection elements connected to the integrated circuit, a package material enclosing the integrated circuit, and a mechanical element allowing a mechanical connection of a further element to the integrated circuit package, wherein the mechanical element is a bearing element, and the integrated circuit package further comprising a sensor inside the package, an external connection axis supported by the bearing element, and a sensor activation element attached to the external connection axis.

13. The integrated circuit package of claim 12, wherein the sensor is a Hall or magneto-resistive e sensor.

14. The integrated circuit package of claim 12, wherein the sensor activation element is an active-type element or a passive-type element.

15. An integrated circuit package comprising an integrated circuit, external connection elements connected to the integrated circuit, a package material enclosing the integrated circuit, and a mechanical element allowing a mechanical connection of a further element to the integrated circuit package, wherein the integrated circuit package further comprises a sensor element electrically connected to the integrated circuit, and the mechanical element is not providing an external communication channel to the sensor element.

* * * * *